(12) United States Patent
Ning et al.

(10) Patent No.: US 11,887,668 B2
(45) Date of Patent: Jan. 30, 2024

(54) ALL LEVELS PROGRAMMING OF A MEMORY DEVICE IN A MEMORY SUB-SYSTEM

(71) Applicant: Micron Technology, Inc., Boise, ID (US)

(72) Inventors: Sheyang Ning, San Jose, CA (US); Lawrence Celso Miranda, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 17/669,074

(22) Filed: Feb. 10, 2022

(65) Prior Publication Data
US 2022/0310165 A1 Sep. 29, 2022

Related U.S. Application Data

(60) Provisional application No. 63/225,772, filed on Jul. 26, 2021, provisional application No. 63/209,592,
(Continued)

(51) Int. Cl.
G11C 16/00 (2006.01)
G11C 16/10 (2006.01)
G11C 16/08 (2006.01)
(Continued)

(52) U.S. Cl.
CPC .......... G11C 16/10 (2013.01); G11C 16/0483 (2013.01); G11C 16/08 (2013.01);
(Continued)

(58) Field of Classification Search
CPC ......... G11C 16/34; G11C 16/10; G11C 16/04; G11C 16/08; G11C 16/24; G11C 11/56;
(Continued)

(56) References Cited

U.S. PATENT DOCUMENTS 10,522,232 B2 * 12/2019 Chen ................... H01L 29/7884
2009/0122610 A1 5/2009 Danon et al.
(Continued)

OTHER PUBLICATIONS

Notification of Transmittal of International Search Report and Written Opinion for International Application No. PCT/US2022/022222, dated Jul. 6, 2022, 12 Pages.
(Continued)

Primary Examiner — Thong Q Le
(74) Attorney, Agent, or Firm — Lowenstein Sandler LLP

(57) ABSTRACT

Control logic in a memory device identifies a set of a plurality of memory cells configured as multi-level cell (MLC) memory to be programmed during a program operation and applies, during a first time period of the program operation, a ramping wordline voltage to a set of wordlines associated with the memory array. The control logic causes, during the first time period, a disconnection of a set of pillars associated with the set of memory cells from a voltage supply and ground voltage, wherein each pillar corresponds to a programming level of a set of programming levels. The control logic further causes, during a second time period of the program operation, a set of programming pulses to be applied to the set of memory cells, wherein each programming pulse of the set of programming pulses programs each programming level of the set of programming levels associated with the identified set of memory cells.

20 Claims, 11 Drawing Sheets

Related U.S. Application Data filed on Jun. 11, 2021, provisional application No. 63/166,474, filed on Mar. 26, 2021.

(51) Int. Cl.
  *G11C 16/04* (2006.01)
  *G11C 16/34* (2006.01)
  *G11C 16/24* (2006.01)
  *G11C 16/26* (2006.01)

(52) U.S. Cl.
  CPC .............. *G11C 16/24* (2013.01); *G11C 16/26* (2013.01); *G11C 16/3459* (2013.01)

(58) Field of Classification Search
  CPC .......... G11C 7/04; G11C 16/16; G11C 16/28; G11C 7/10; G11C 11/34; G11C 16/26; G11C 16/30; G11C 16/32; G11C 7/12; G11C 11/22; G11C 11/406; G11C 16/02; G11C 16/06; G11C 16/12; G11C 8/14; G11C 11/28; G11C 16/22
  See application file for complete search history.

(56) References Cited

U.S. PATENT DOCUMENTS

| | | |
|---|---|---|
| 2010/0246271 A1 | 9/2010 | Sarin et al. |
| 2011/0103151 A1 | 5/2011 | Kim et al. |
| 2013/0258773 A1 | 10/2013 | Honma |
| 2015/0043275 A1 | 2/2015 | Srinivasan et al. |
| 2016/0351270 A1 | 12/2016 | Ehrlich et al. |
| 2019/0180831 A1 | 6/2019 | Shukla et al. |
| 2019/0371417 A1 | 12/2019 | Hsieh et al. |
| 2020/0202964 A1 | 6/2020 | Sako |
| 2020/0350021 A1 | 11/2020 | Lee |

OTHER PUBLICATIONS

Notification of Transmittal of International Search Report and Written Opinion for International Application No. PCT/US2022/022224, dated Jul. 14, 2022, 10 Pages.

\* cited by examiner

FIG. 3

ALL LEVELS PROGRAMMING OF A MEMORY DEVICE IN A MEMORY SUB-SYSTEM

CROSS-REFERENCE TO RELATED APPLICATIONS

This application claims the benefit of U.S. Provisional Application No. 63/166,474, titled "All Levels Programming of a Memory Device in a Memory Sub-system," filed Mar. 26, 2021, U.S. Provisional Application No. 63/225,772, titled "Level Shifting in All Levels Programming of a Memory Device in a Memory Sub-system," filed Jul. 26, 2021, and U.S. Provisional Application No. 63/209,592, titled "In-line Programming Adjustment of a Memory Cell in a Memory Sub-System," filed Jun. 11, 2021. The entire disclosures of U.S. Provisional Application No. 63/166,474, U.S. Provisional Application No. 63/225,772, and U.S. Provisional Application No. 63/209,592 are hereby incorporated herein by reference.

TECHNICAL FIELD

Embodiments of the disclosure relate generally to memory sub-systems, and more specifically, relate to all levels programming of a memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a block schematic of a portion of an array of memory cells as could be used in a memory of the type described with reference to FIG. 1B according to an embodiment.

DETAILED DESCRIPTION

Figure 1A:
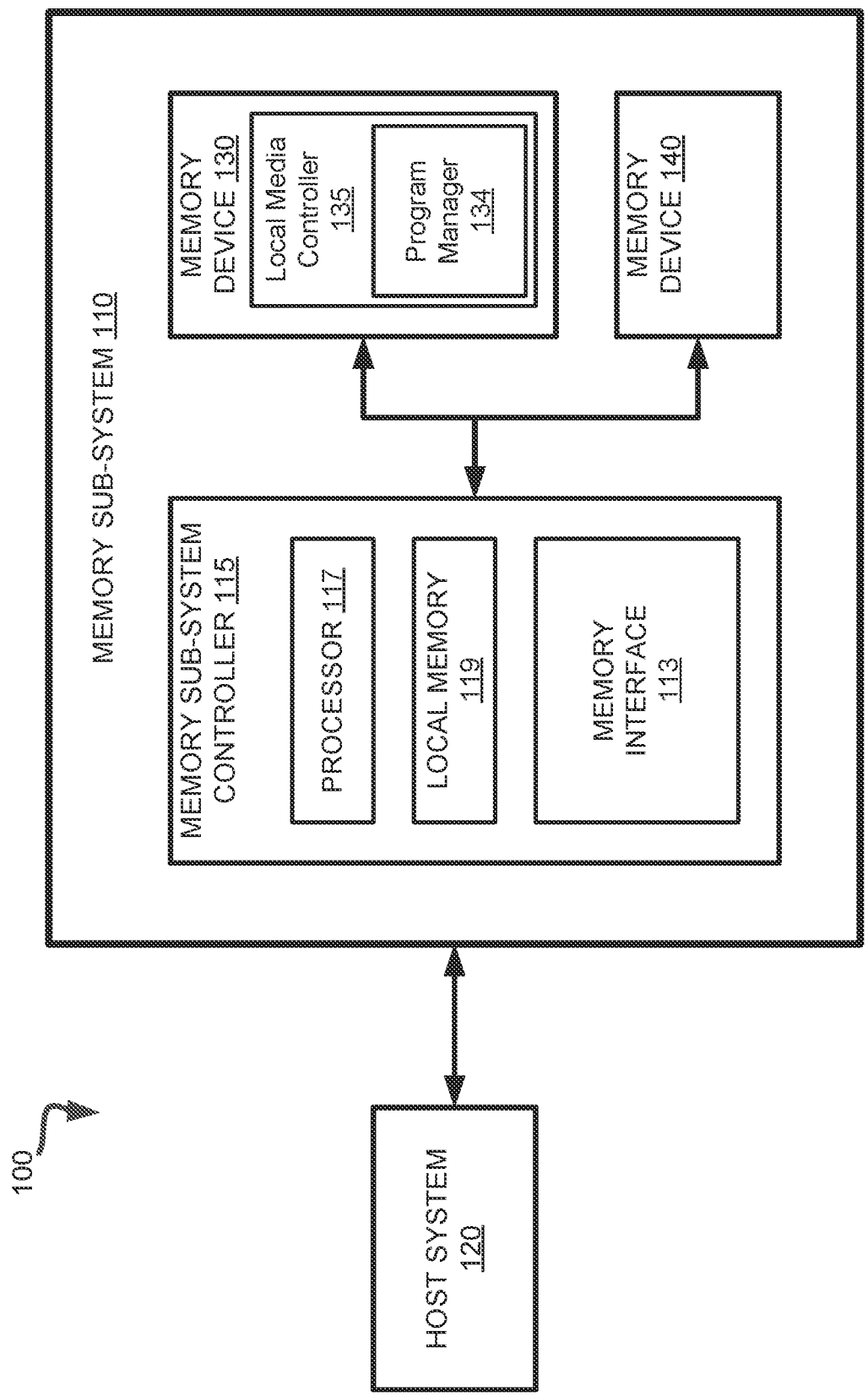
FIG. 1A illustrates an example computing system that includes a memory sub-system in accordance with some embodiments.

Aspects of the present disclosure are directed to all levels programming of a memory device in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Memory cells are formed on a silicon wafer in an array of columns (also hereinafter referred to as "bitlines") and rows (also hereinafter referred to as "wordlines"). A wordline can refer to one or more rows of memory cells of a memory device that are used with one or more bitlines to generate the address of each of the memory cells. The intersection of a bitline and wordline constitutes the address of the memory cell.

A block hereinafter refers to a unit of the memory device used to store data and can include a group of memory cells, a wordline group, a wordline, or individual memory cells. Each block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines (i.e., wordlines) often fabricated in common with the memory cells, so as to form an array of strings in a block of memory (e.g., a memory array). The compact nature of certain non-volatile memory devices, such as 3D flash NAND memory, means wordlines are common to many memory cells within a block of memory. Some memory devices use certain types of memory cells, such as triple-level cell (TLC) memory cells, which store three bits of data in each memory cell, which make it affordable to move more applications from legacy hard disk drives to newer memory sub-systems, such as NAND solid-state drives (SSDs).

Memory access operations (e.g., a program operation, an erase operation, etc.) can be executed with respect to the memory cells by applying a wordline bias voltage to wordlines to which memory cells of a selected page are connected. For example, during a programming operation, one or more selected memory cell can be programmed with the application of a programming voltage to a selected wordline. In one approach, an Incremental Step Pulse Programming (ISPP) process or scheme can be employed to maintain a tight cell threshold voltage distribution for higher data reliability. In ISPP, a series of high-amplitude pulses of voltage levels having an increasing magnitude (e.g., by a predefined pulse step height) are applied to wordlines to which one or more memory cells are connected to gradually raise the voltage level of the memory cells to above a wordline voltage level corresponding to the memory access operation (e.g., a target program level). The application of the uniformly increasing pulses by a wordline driver of the memory device enables the selected wordline to be ramped or increased to a wordline voltage level ($V_{wl}$) corresponding to a memory access operation. Similarly, a series of voltage pulses having a uniformly increasing voltage level can be applied to the wordline to ramp the wordline to the corresponding wordline voltage level during the execution of an erase operation.

The series of incrementing voltage programming pulses are applied to the selected wordline to increase a charge level, and thereby a threshold voltage, of each memory cell connected to that wordline. After each programming pulse, or after a number of programming pulses, a program verify operation is performed to determine if the threshold voltage of the one or more memory cells has increased to a desired programming level. For example, the pulses can be incrementally increased in value (e.g., by a step voltage value such as 0.33V) to increase a charge stored on a charge storage structure corresponding to each pulse. The memory device can reach a target programming level voltage for a particular programming level by incrementally storing or increasing amounts of charge corresponding to the programming step voltage.

According to this approach, the series of programming pulses and program verify operations are applied to program each programming level (e.g., programming levels L1 to L7 for a TLC memory cell) in sequence. For example, this approach sequentially programs the levels of the memory cell (e.g., L1 to L7) by applying a first set of pulses to program level L1 to a first target voltage level, followed by the application of a second set of pulses to program level L2 to a second target voltage level, and so on until all of the levels are programmed.

In this approach, each level may require multiple programming pulses and program verify operations to reach the target programming voltage associated with the respective programming level. Accordingly, this results in a long time to program (e.g., a time from an initial programming pulse until the program verify threshold voltage is reached, also referred to as Tprog) associated with the one or more memory cells. For example, programming each level of a TLC memory cell (e.g., programming levels L1 to L7) one at a time requires a high number of total programming pulses (e.g., approximately 24 pulses) and a high number of associated program verify operations (e.g., approximately 42 program verify operations). In this example, if a time associated with each pulse is 37.5 µs, resulting in a total time for the set of pulses (i.e., 24 pulses) of 900 µs. In addition, the time associated with performing the program verify operations can add an additional 900 µs, resulting in a total program time of, for example, 1800 µs.

In addition, programming each level in sequence results in a higher energy per bit and a higher peak current levels, which can cause performance degradation. In particular, this approach requires faster wordline ramping which causes high peak current levels or spikes.

Aspects of the present disclosure address the above and other deficiencies by implementing all levels programming of a memory device in a memory sub-system. In one embodiment, rather than sequentially programming the multiple programming levels (e.g., levels L1 to L7 of a TLC memory cell), each programming pulse programs all of the levels together. In an embodiment, the all levels programming operation is executed to enable each programming pulse to program all of the levels of a selected wordline. In an embodiment, the all levels programming operation includes a first phase wherein an increasing or ramping wordline voltage (e.g., a voltage applied to one or more wordlines that is periodically ramped or increased by a step voltage amount) is applied to a set of wordlines of the memory array (e.g., the selected wordline and one or more unselected wordlines). In an embodiment, during the first phase, respective pillars (e.g., vertical conductive traces) corresponding to programming levels (e.g., L1 to L6 for a TLC memory device) are floated (e.g., disconnected from both a voltage supply and a ground). In an embodiment, a set of pillars corresponding to different programming levels are floated in sequence during the first phase (e.g., a first pillar corresponding to L1 is floated at a first time, a second pillar corresponding to L2 is floated at a second time, and so on).

In an embodiment, a pillar can be floated by turning both a select gate drain (SGD) and select gate source (SGS) off (e.g., a selected SGD is toggled from a high voltage level (Vsgd_high) to approximately 0V to prevent a corresponding bitline from discharging to the corresponding pillar). In an embodiment, a bitline corresponding to the first pillar associated with the programming level L1 is toggled from approximately 0V to a high voltage level (Vbl_high) to ensure the pillar remains floating during the remainder of the first phase (e.g., application of the ramping wordline voltage).

In an embodiment, once a pillar is floated, a voltage of each pillar can be boosted or increased in accordance with a step or increase of the ramping wordline voltage. At the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains 0V during the first phase).

In an embodiment, the all levels programming operation includes a second phase wherein a programming pulse is applied to the target wordline. In an embodiment, the programming pulse is applied to program all of the programming levels (e.g., L1 to L7 for a TLC memory device). In an embodiment, the first phase and the second phase can be iteratively performed until the programming of all of the programming levels has been verified. In an embodiment, each iteration of the second phase of the programming operation includes the application of a programming pulse, wherein each programming pulse programs all of the programming levels together.

For each pulse of the set of pulses, a program verify operation can be performed for each programming level to verify that target voltage corresponding to each respective programming level has been reached. This results in a significant reduction in the number of programming pulses that is needed to program all of the levels of the target wordline. Advantages of this approach include, but are not limited to, improved performance in the memory sub-system. The reduction in the number of required program pulses to program all of the levels enables a lower time to program, less energy per bit, and a reduction in peak wordline current. In addition, in an embodiment, program verify operations are performed for each program pulse and each programming levels, therefore no program verify skipping is needed, thereby simplifying the control of the memory sub-system and achieving verified target programming levels. Accordingly, the overall quality of service level provided by the memory sub-system is improved.

Furthermore, following each programming pulse, various program distributions of memory cells corresponding to different memory cells are established. Each distribution can include cells that are programmed at different rates than other cells corresponding to the same programming level. For example, a fast cell can have a higher threshold voltage than a slow cell, for a given programming period. Therefore, faster memory cells may be programmed before the slower cells since the faster cells can require fewer programming pulses. This can result in the threshold voltage (Vt) or program distribution for the faster cells being different than the threshold voltage distribution for slower cells. In addition, slower memory cells can have a relatively lower threshold voltage than other memory cells corresponding to the same programming level, for a given programming period.

According to aspects of the present disclosure, following the application of a programming pulse as part of the all levels programming operation, one or more regions of memory cells within a programming distribution corresponding to a target programming level (e.g., target level Ln) can be identified. The one or more regions of memory cells can be identified as relating to fast cells based on a comparison of the corresponding threshold voltage following the pulse and one more program verify voltage levels (e.g., a region of memory cells located in an upper tail of the corresponding program distribution). In an embodiment, the one or more memory cells identified in the one or more regions can be subject to a level-shifting operation wherein the identified memory cells are logically shifted to a lower programming level (e.g., Ln−1, Ln−2, etc.) and programmed using a lower level programming strength during a subsequent iteration of the first phase and second phase of the all-levels programming operation.

Aspects of the present disclosure further relate to the identification of one or more regions of slow memory cells based on a comparison of the corresponding threshold voltage following the pulse and one more program verify voltage levels (e.g., a region of memory cells located in a lower tail of the corresponding program distribution). In an embodiment, the one or more memory cells identified in these one or more regions can be subject to a level-shifting operation wherein the identified memory cells are logically shifted from a first programming level (e.g., Ln+1) to a higher programming level (e.g., Ln+2, Ln+3, etc.) and programmed using a higher level programming strength during a subsequent iteration of the first phase and second phase of the all-levels programming operation.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory device(s) 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory device(s) 130 to perform operations such as reading data, writing data, or erasing data at the memory device(s) 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device(s) 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device(s) 130. For example, memory interface component 113 can send memory access commands corresponding to requests received from host system 120 to the memory device(s) 130, such as program commands, read commands, or other commands. In addition, memory interface component 113 can receive data from memory device(s) 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, the memory device(s) 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of the one or more memory device(s) 130. The memory array can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, the program manager 134 can receive data to be programmed to the memory device(s) 130 (e.g., a TLC memory device). Accordingly, the program manager 134 can execute an all levels programming operation to program each memory cell to one of 8 possible programming levels (i.e., voltages representing the 8 different values of those three bits). In one embodiment, program manager 134 can program memory cells in the TLC portion of the memory array to all of the multiple respective programming levels (e.g., programming levels L0, L1, L2 . . . L7), wherein each programming pulse programs all of the programming levels from L1 to L7. For example, upon identifying a set of memory cells to be programmed (e.g., the memory cells associated with one or more wordlines of the memory array), the program manager 134 can execute a first phase of the all levels programming operation wherein a ramping wordline voltage is applied and each pillar corresponding to the respective programming levels is floated. In an embodiment, a voltage of each pillar (Vpillar) when floated can be boosted using the ramping wordline voltage.

In an embodiment, the program manager 134 can execute a second phase of the all levels programming operation to cause a single program pulse (e.g., a set of programming pulses) to be applied to the identified set of memory cells to program those memory cells to each of the multiple respective programming levels (i.e., L1, L2, . . . L7). In an embodiment, the program manager 134 can perform a program verify operation corresponding to each programming pulse and programming level to verify whether the memory cells in the set were programmed to all of the respective programming levels. The program manager 134 can execute the first phase and the second phase (wherein each iteration of the second phase includes the application of programming pulse) until all of the programming levels have reached the corresponding target program voltage level. The program manager 134 can identify one or more regions of memory cells of a target programming distribution (e.g., Ln) that satisfies a condition associated with one or more program verify voltage levels associated with the target programming level and logically shifts the memory cells in those regions to a lower programming level (e.g., Ln−1, Ln−2, etc.) (also referred to as a "level shifting down operation" or "down-level shifting operation"). In this embodiment, the memory cells in the one or more identified regions are programmed using a lower programming strength during a subsequent iteration of the first phase and second phase of the all-levels programming operation. In addition, the program manager 134 can identify one or more regions of memory cells of a programming distribution (e.g., Ln+1) that have a threshold voltage that satisfies a condition corresponding to one or more program verify voltage levels associated with another programming level (e.g., Ln) and logically shifts the memory cells in those regions to a higher programming level (e.g., Ln+2, Ln+3, etc.) (also referred to as a "level shifting up operation" or "up-level shifting operation"). In this embodiment, the memory cells in these regions are programmed using a higher programming strength) during a subsequent iteration of the first phase and second phase of the all-levels programming operation. Further details with regards to the operations of program manager 134 are described below.

Figure 1B:
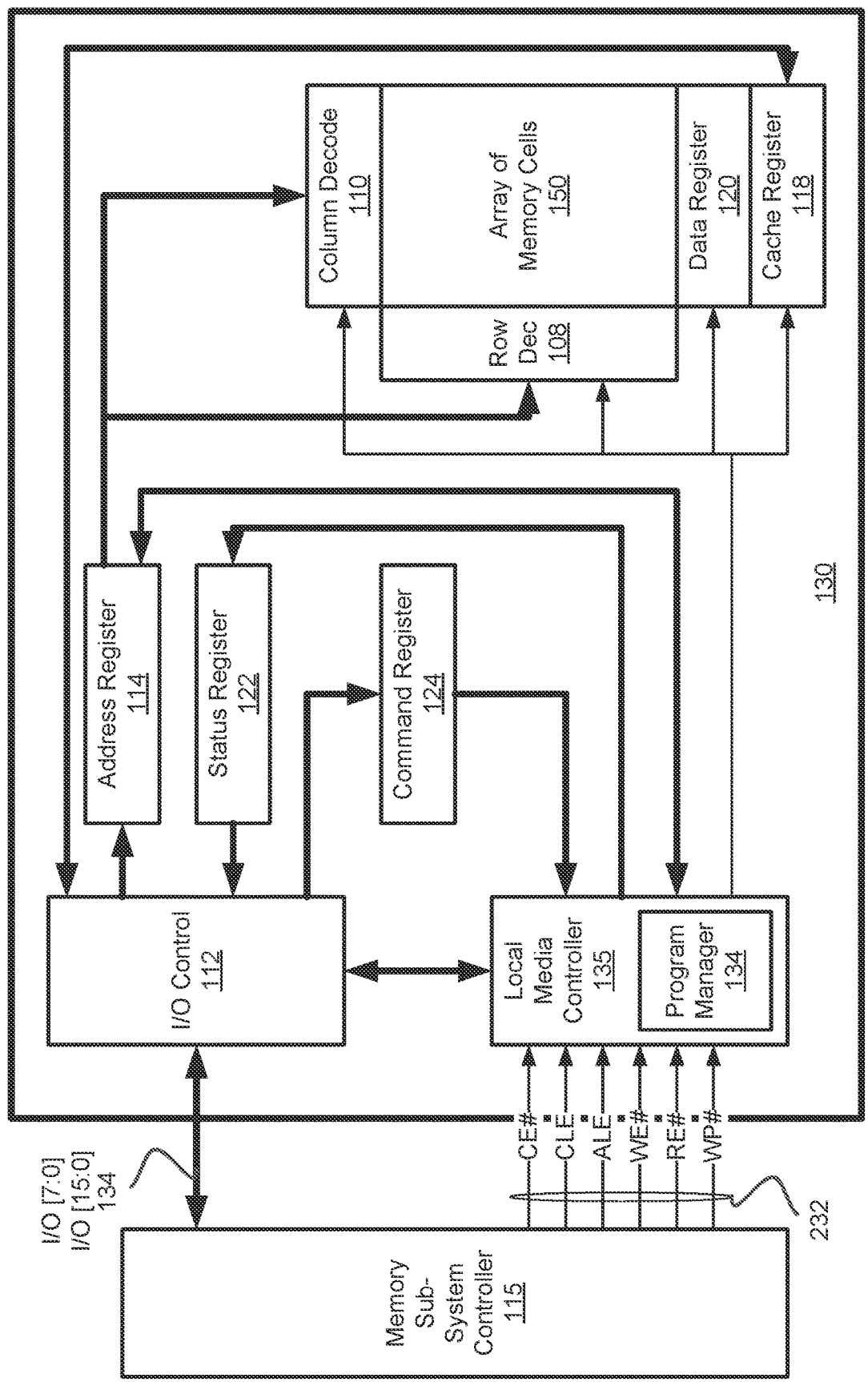
FIG. 1B is a block diagram of memory device(s) in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 250 are capable of being programmed to one of at least two target data states.

Row decode circuitry 108 and column decode circuitry 110 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 212 and row decode circuitry 108 and column decode circuitry 110 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 110 to control the row decode circuitry 108 and column decode circuitry 110 in response to the addresses. In one embodiment, local media controller 134 includes program manager 134, which can implement the all levels programming of memory device 130, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 120 for transfer to the array of memory cells 150; then new data may be latched in the cache register 118 from the I/O control circuitry 212. During a read operation, data may be passed from the cache register 118 to the I/O control circuitry 112 for output to the memory sub-system controller 115; then new data may be passed from the data register 120 to the cache register 118. The cache register 118 and/or the data register 120 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 150.

In an embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

In an embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/P pins (or other I/O node structures) may be used in the various embodiments.

Figure 2A:
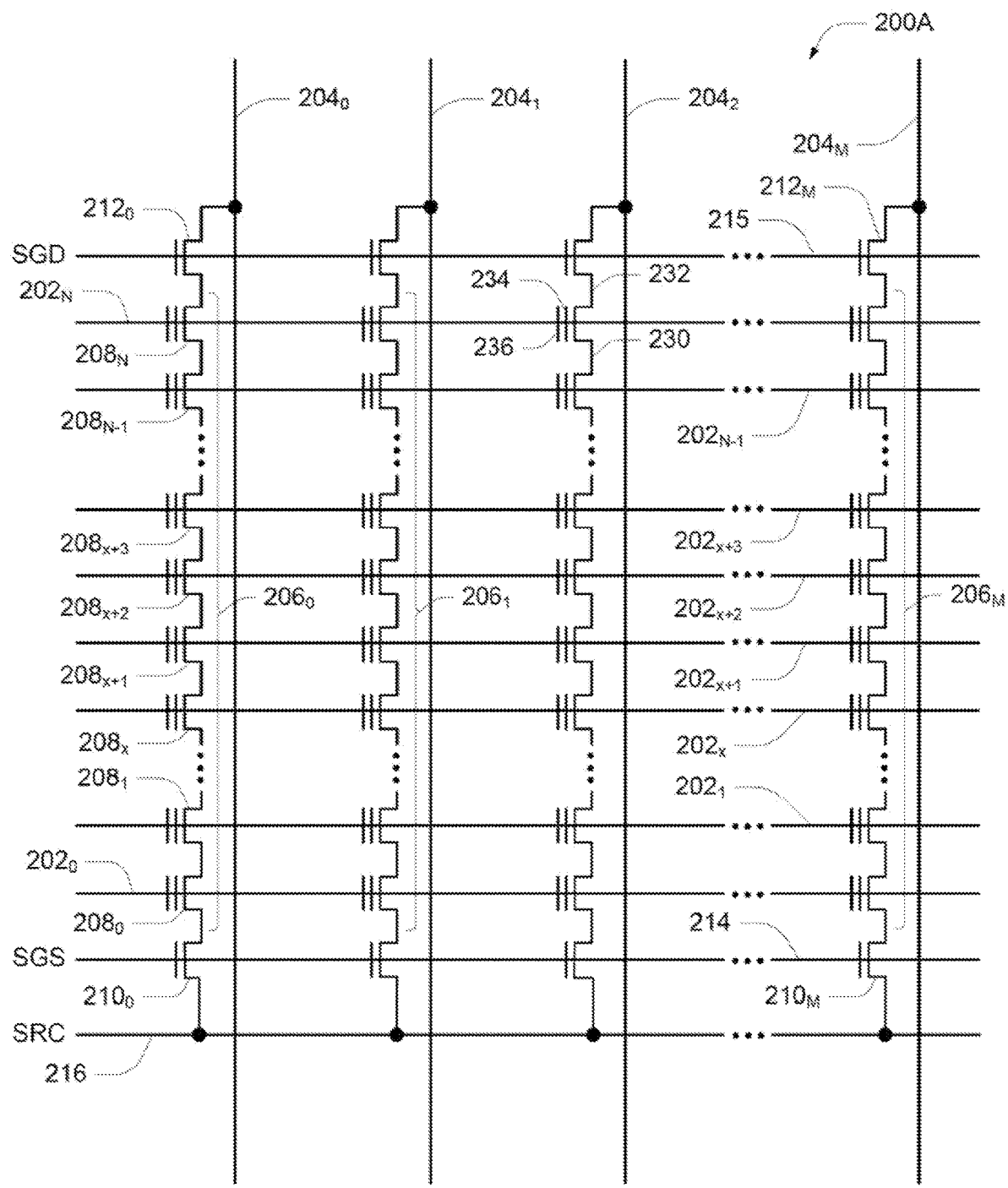
FIG. 2A-2C are schematics of portions of an array of memory cells as could be used in a memory of the type described with reference to FIG. 1B according to an embodiment.
Figure 2B:
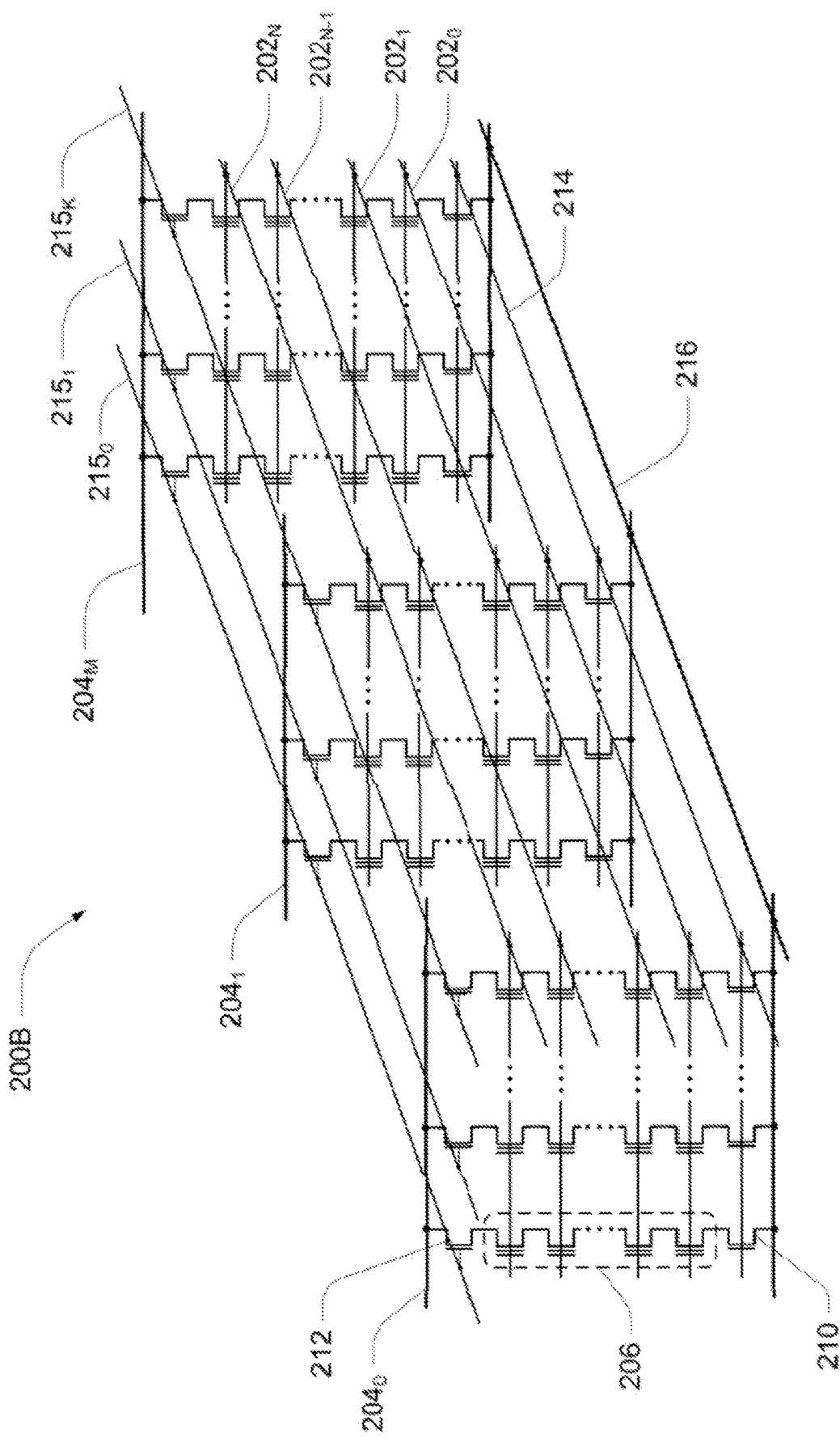
Figure 2C:
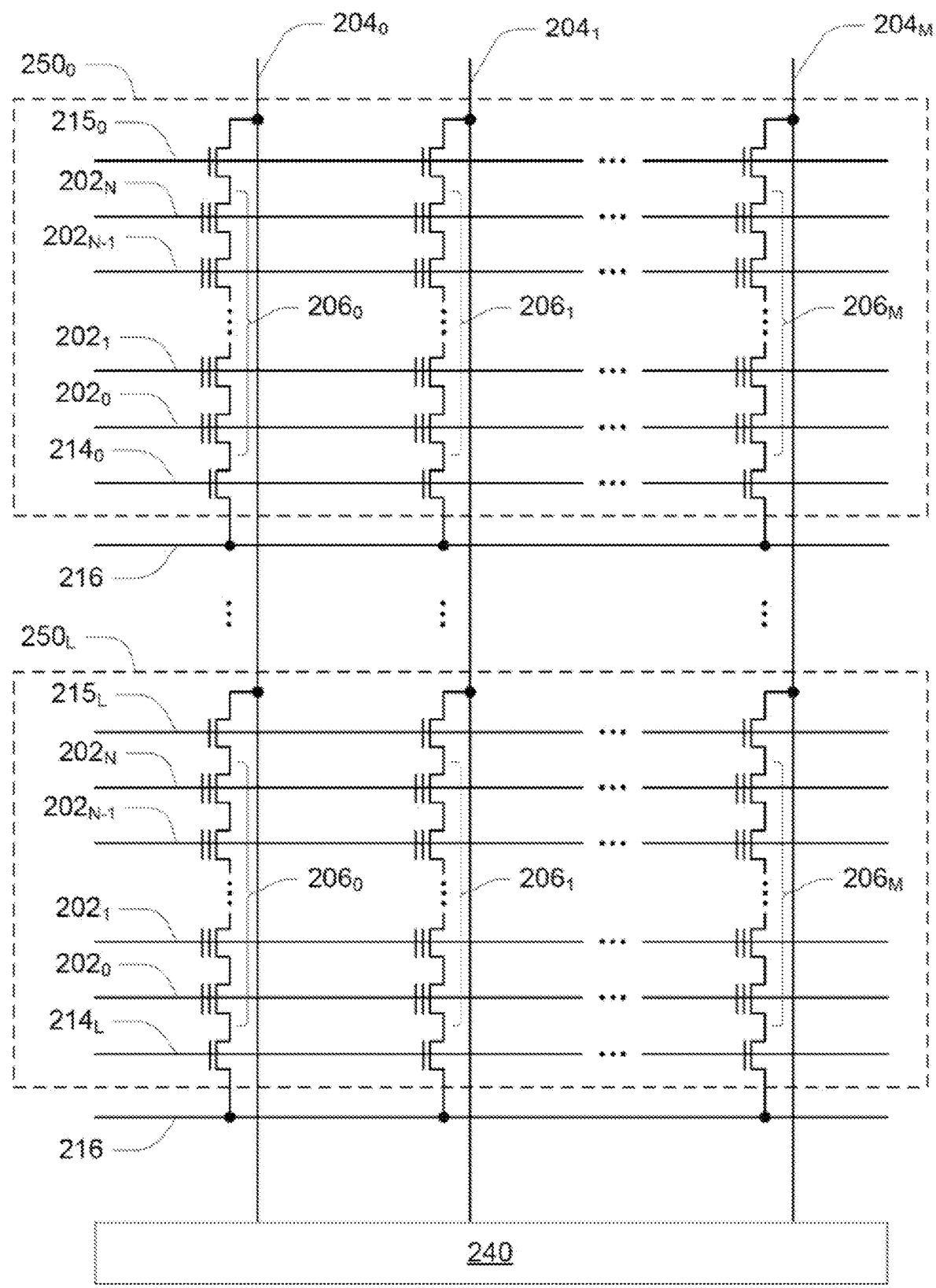

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 3:
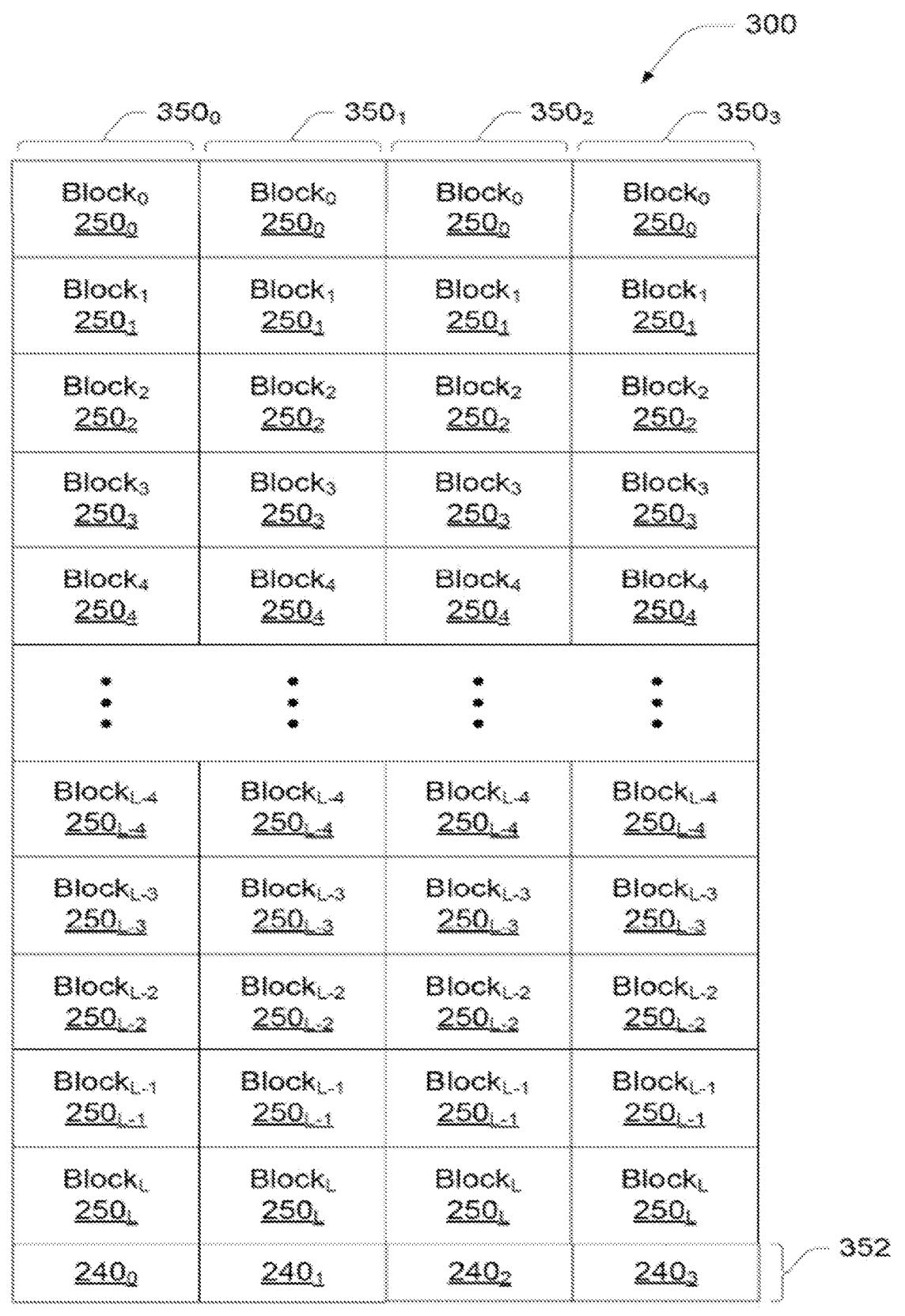

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
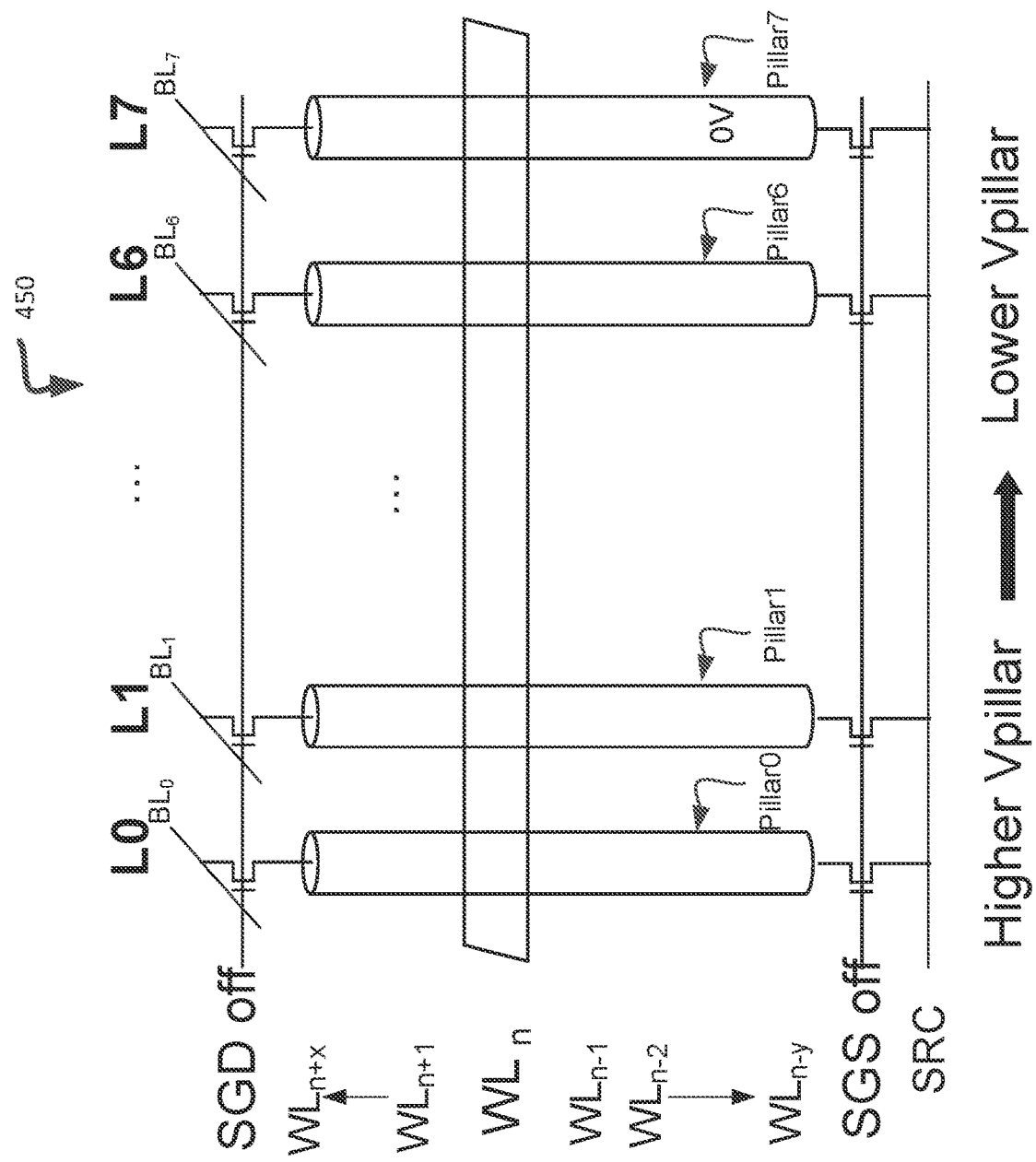
FIG. 4 illustrates an example memory array including wordlines and bitlines corresponding to multiple programming levels to be programmed according to an all levels programming operation in accordance with one or more embodiments of the present disclosure.

FIG. 4 illustrates an example set of pillars in an example memory array 450. As shown in FIG. 4, the example memory array 450 of a TLC memory device includes wordlines (e.g., a target wordline (WLn), a first set of unselected wordlines (e.g., WLn−1 and WLn+1 to WLn+x), a second set of unselected wordlines (e.g., WLn−2 to WLn−y) and a set of bitlines (e.g., BL0 to BL7) corresponding to an erase level (L0) and multiple programming levels (L1, . . . L7) to be programmed according to an all levels programming operation in accordance with one or more embodiments of the present disclosure. As shown in FIG. 4, the memory array 450 may be arranged in rows (each corresponding to a wordline) and columns (each corresponding to a bitline), wherein the intersection of a wordline and bitline constitutes the address of the memory cell. Each column may include a string of series-connected memory cells connected (e.g., selectively connected) to a common source (SRC). The common source can be coupled to a reference voltage (e.g., ground voltage or simply "ground" (Gnd) or a voltage source (e.g., a charge pump circuit or power supply which may be selectively configured to a particular voltage suitable for optimizing a programming operation, for example). A string of memory cells may be connected in series between a first select transistor (e.g., a source-side select transistor) referred to as a source select gate (SGS) and a second select transistor (e.g., a drain-side select transistor) referred to as a drain select gate (SGD). The source select transistors may be commonly connected to a first select line (e.g., a source select line) and the drain select transistors may be commonly connected to a second select line (e.g., a drain select line).

As shown in FIG. 4, the memory array 450 includes a set of pillars (e.g., Pillar0, Pillar1 . . . Pillar7) corresponding to substantially vertical strings of series coupled memory cells of the memory array 450. In an embodiment, the pillars refer to the channel regions (e.g., composed of polysilicon) of the access transistors of a vertical string of memory cells. According to embodiments, each of the pillars are floated and a corresponding voltage is boosted at different voltage levels (Vpillar) at different times by turning the source-side select transistor (SGS) and the drain-side select transistor (SGD) off. In an embodiment, the channel region is first discharged to ground before being floated and boosted to a particular voltage. In an embodiment, once a respective pillar is floated, a voltage of each pillar (Vpillar) can be boosted or increased in accordance with a step or increase of a ramping wordline voltage, as described in greater detail with respect to FIG. 5.

Figure 5:
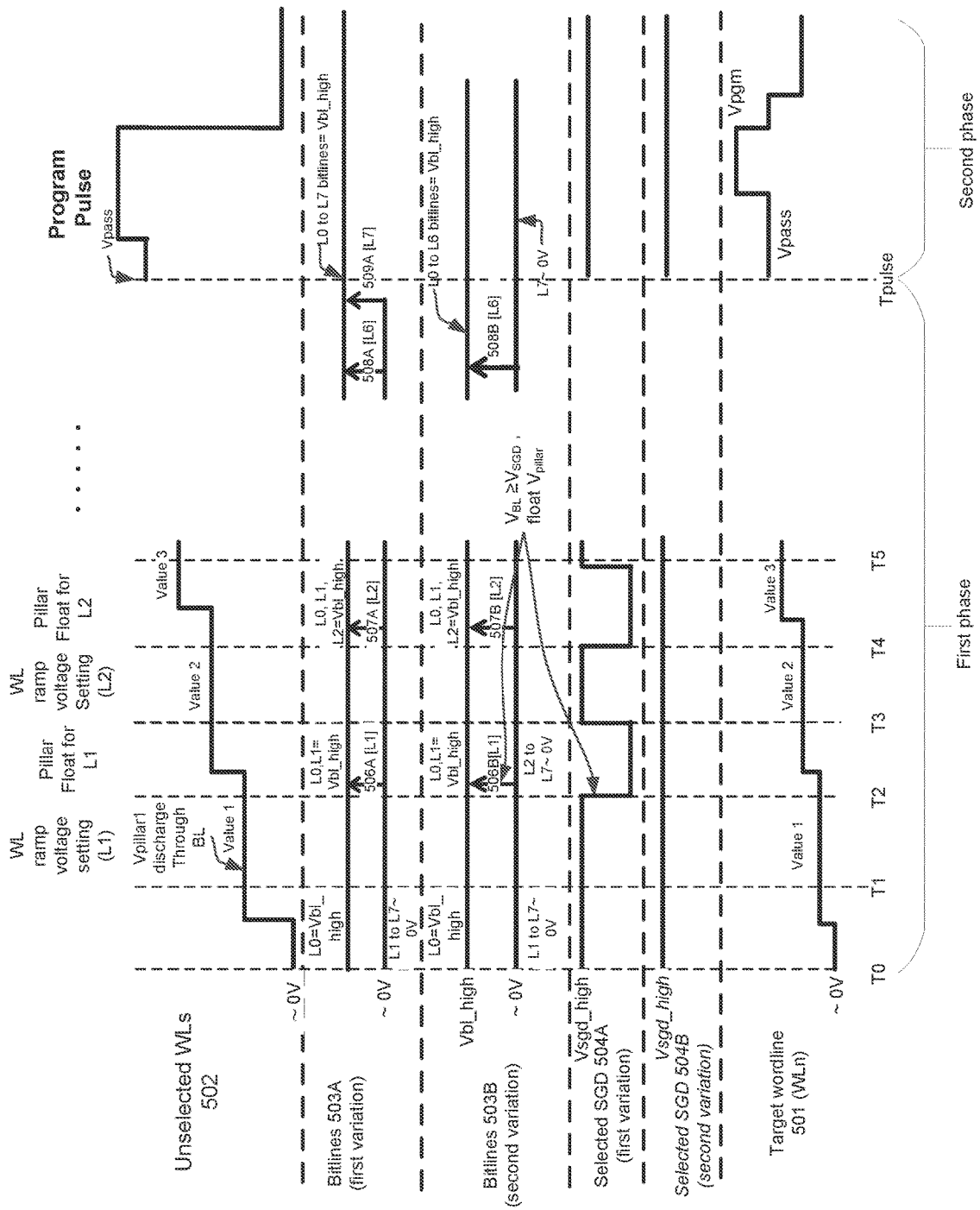
FIG. 5 illustrates example programming pulse waveforms corresponding to all levels programming of a memory device in a memory sub-system in accordance with one or more embodiments of the present disclosure.

FIG. 5 illustrates example voltage waveforms of various portions of a memory array during execution of an all-level programming process. In an embodiment, the portions of the memory array include a set of memory cells associated with a target wordline 501 (WLn) and portions of corresponding voltage waveforms resulting from execution of an all levels programming operation (such as the operations of method 700, described in greater detail below), according to embodiments of the present disclosure. In an embodiment, the processing logic identifies a set of memory cells to be programmed by an all levels programming operation (e.g., target wordline 501 (WLn)). In an embodiment, the all levels programming operation includes a first phase (starting from time T0) wherein a ramping wordline voltage is applied to a set of wordlines (e.g., target wordline 501 and a set of one or more unselected wordlines 502). For example, as shown in FIG. 5, a ramping wordline voltage is applied to wordline 501 where the voltage is incrementally ramped from 0V to 3V between T0 and T5. While the ramping wordline voltage is applied, a set of pillars corresponding to different programming levels are sequentially floated (e.g., by uncoupling the set of pillars in operation 330). In an embodiment, a second set of unselected wordlines (e.g., WLn−2 and below) are set to 0V (e.g., the voltage of the source select gate (VSGS) is 0V, and the unsel_SGD=0V).

With reference to FIG. 4, at the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains approximately 0V during the first phase).

In an embodiment, prior to the first phase shown in FIG. 5 (e.g., prior to the application of the ramping wordline voltage), the pillar associated with the erase level (L0) is floated, a bitline 503A (according to a first variation), 503B (according to a second variation) corresponding to L0 is set to $V_{BL\_high}$, and a selected SGD (Sel_SGD 504A, Sel_SGD 504B) is set to Vsgd_high. In an embodiment, the selected SGD can be toggled between Vsgd_high to a ground (e.g., approximately 0V), as shown with respect to a first waveform corresponding to Sel_SGD 504A. In accordance with another embodiment, the selected SGD can remain at Vsgd_high during the first phase, as shown with respect to a second waveform corresponding to Sel_SGD 504B. In an embodiment, the use of sel_SGD 504A (e.g. the toggling variation) is a first variation that can be implemented by the processing logic. In another embodiment, the use of Sel_SGD 504B (e.g., the variation wherein Sel_SGD 504B remains at Vsgd_high) is a second variation that can be implemented by the processing logic.

As shown in FIG. 5, between time T0 and T1, a first ramp of the ramping wordline voltage (e.g., from approximately 0V to value 1, in accordance with the step voltage) is applied. During a time between T1 and T2, the ramping wordline voltage is applied to a first pillar (e.g., Pillar1 of FIG. 4) corresponding to programming level L1. In an embodiment, during this time period, the voltage of Pillar1 (Vpillar1) is discharged through the bitline 503A, 503B corresponding to L1 which is set to ground (e.g., approximately 0V).

In an embodiment, a selected SGD 504A and the voltage levels of the bitlines 503A, 503B can be used to float the pillars in sequence and boost the corresponding pillar voltages (e.g., Vpillar) when each respective pillar is in the floating state. As shown in FIG. 5, during a first time period (e.g., T0 to T2), a voltage level applied to a selected SGD 504A ($V_{SGD}$) is a high source voltage level (Vsgd_high). In an embodiment, as shown in FIG. 5, at time T2, the selected SGD 504A can be toggled from Vsgd_high to ground (e.g., approximately 0V) in order to float the first pillar (e.g., Pillar1 of FIG. 4) corresponding programming level L1. As shown in FIG. 5, at time t2, the toggling of the selected SGD 504A from Vsgd_high to ground (e.g., approximately 0V) disconnects Pillar1 and floats the voltage of Pillar1 (Vpillar1) corresponding to programming level L1. In an embodiment, in response to or following the toggling of $V_{SGD}$ (e.g., toggling the selected SGD 504A), the L1 bitline is caused to toggle from ground (e.g., 0V) to a high voltage ($V_{BL\_high}$), as illustrated by the arrow 506A for the first variation and arrow 506B for the second variation. In an embodiment, the toggling of the L1 bitline to $V_{BL\_high}$ ensures Pillar1 is floated and Vpillar1 can be boosted in accordance with the wordline ramping level at the time of the floating. In an embodiment, Pillar1 is floated when the voltage of the bitline ($V_{BL}$) is greater than or equal to $V_{SGD}$)

In the example shown in FIG. 5, the Vpillar1 is boosted while Pillar1 is floated (e.g., in the floating state) and exposed to a longest relative duration of the application of the ramping wordline voltage to the target wordline, wherein the ramping wordline voltage is periodically increased or stepped by a wordline step voltage level. In this example, the Vpillar1 remains floating from T2 to the end of the first phase (e.g., in view of the setting of the corresponding bitline to $V_{BL\_high}$) and is repeatedly boosted by the ramping wordline voltage each time the ramping wordline voltage is ramped or increased. At the end of phase 1, Vpillar1 is boosted by the wordline step voltage (or a preset boost ratio of the wordline step voltage). For example, the Vpillar1 is boosted to value 7 (e.g., approximately 7V) after completion of the first phase (e.g., Vpillar1=[total ramping wordline voltage (e.g., approximately 8V)]−[the wordline voltage level at the time Vpillar1 is floated (e.g., 1V)]).

In an embodiment, as shown in FIG. 5, following the toggling of the selected SGD 504A (at time T2), and the corresponding increase of the L1 bitline voltage level from approximately 0V to $V_{BL\_high}$ (as illustrated by arrow 506A for the first variation and arrow 506B for the second variation), the bitline voltage level (e.g., $V_{BL}$) is greater than the $V_{SGD}$, resulting in Pillar1 remaining in a floating state and subject to boosting by the ramping wordline voltage until the end of the first phase As shown in FIG. 5, the floating of respective pillars continues for each of the set of pillars (e.g., pillars corresponding to L1 to L6) to enable each Vpillar to be boosted in accordance with the ramping wordline voltage. For example, at time T3, the selected SGD 504A is toggled from approximately 0V to Vsgd_high to enable the setting of the ramping wordline voltage in accordance with a next step or increase. It is noted that the SGD 504A is shared between the various strings and pillars such that the toggling of the SGD 504A from low to high (e.g., at time T3) does not affect Vpillar1 (e.g., the Vpillar for the pillars floated prior to the toggling of SGD 504A from low to high are not affected). As shown in FIG. 5, during a time period between T3 and T4 when the selected SGD 504A is Vsgd_high and VBL2 is approximately 0V, value 2 of the ramping wordline voltage is applied. At time T4, Pillar2 is floated by toggling the selected SGD 504A from Vsgd_high to ground (e.g., approximately 0V). In an embodiment, following the toggling of the selected SGD 604A to Vsgd_high, the L2 bitline toggles from ground (e.g., approximately 0V) to $V_{BL\_high}$, as illustrated by the arrow 507A for the first variation and arrow 507B for the second variation. In an embodiment, the toggling of the L2 bitline to the inhibit voltage level maintains the floating of Pillar2 for the remainder of the first phase.

In an embodiment, as the ramping wordline voltage is applied, each of the pillars of a set of pillars (e.g., Pillar1 to Pillar6 in FIG. 4) are floated in sequence. With reference to FIG. 4, In an embodiment, a voltage of the pillar corresponding to the erase state (Pillar0) is floated prior to the application of the ramping wordline voltage. For example, Pillar 1 is floated at a first time during application of the ramping wordline voltage, Pillar 2 is floated at a second time during application of the ramping wordline voltage, and so on.

In an embodiment, while a respective pillar is in the floated state, a voltage corresponding to that pillar is boosted by the ramping wordline voltage. For example, Pillar 1 is floated at a first time and is boosted to a pillar voltage level corresponding to each increase of the ramping wordline voltage (e.g., each time the ramping wordline voltage is stepped). In this example, since Pillar 1 is floated at a first time, the corresponding pillar voltage (e.g., Vpillar1) is boosted multiple times in accordance with each increase of the ramping wordline voltage until the end of the wordline ramping phase (e.g., the first phase) of the all levels programming operation, as shown and described in greater detail with respect to FIG. 6.

In an embodiment, as shown in FIG. 4, since the pillars are floated in sequence (e.g., Pillar1 is floated before Pillar2, Pillar2 is floated before Pillar3, and so on), the respective pillar voltages are boosted from higher levels to lower levels moving from left to right in FIG. 4. In this regard, Vpillar1 is higher than Vpillar2, Vpillar2 is higher than Vpillar3, and so on as a function of the time when each pillar is floated. In an embodiment, the Vpillar for a floated pillar is boosted to a higher voltage level each time the ramping wordline voltage increases. As such, pillars that are floated earlier are boosted by a greater number of wordline ramping increases.

Although the portion of the waveforms shown in FIG. 5 relate to the floating of Pillar1 and Pillar2, it is to be appreciated the operations described can be repeated as part of the all levels programming process to float the pillars to move or adjust the corresponding Vpillar levels for each of the remaining programming levels (e.g., L3 to L7 for a TLC memory device) according to the first variation. As shown, according to the first variation, the L6 bitline toggles from ground (e.g., approximately 0V) to $V_{BL\_high}$, as illustrated by the arrow 508A and the L7 bitline toggles from ground (e.g., approximately 0V) to $V_{BL\_high}$, as illustrated by the arrow 509A.

In another embodiment, according to the second variation, Pillar7 corresponding to programming level L7 is not floated due to the corresponding Vpillar being approximately 0V, as shown in FIG. 4B. For example, at the end of the first phase, Vpillar1 is boosted to a first value (e.g., 6V), wherein Vpillar1=[total ramping wordline voltage (e.g., Vpass)]–[the wordline voltage level at the time Pillar1 is floated (e.g., value 1)], Vpillar2 is boosted to a second value (e.g., 5V), wherein Vpillar2=[total ramping wordline voltage (e.g., Vpass)]–[the wordline voltage level at the time Vpillar2 is floated (e.g., value 2)], Vpillar3 is boosted to a third value (e.g., 4V), wherein Vpillar3=[total ramping wordline voltage (e.g., Vpass)]–[the wordline voltage level at the time Vpillar3 is floated (e.g., value 3)], and so on. As shown in FIG. 5, according to the second variation, the L6 bitline toggles from ground (e.g., approximately 0V) to $V_{BL\_high}$, as illustrated by the arrow 508B. Accordingly, the boosted Vpillar is established for each respective pillar.

According to an embodiment, L0 through L7 are approximately 8V (or higher), 6V, 5V, 4V, 3V, 2V, 1V, 0V, respectively. In an embodiment, Vpillar of L0 is equal to Vpass (e.g., between 8V and 10V). In an embodiment, there is a gap between Vpillar of L0 and the Vpillar of L1 (e.g., a gap of 2V or higher). In an embodiment, since Vpillar of L7 is approximately 0V, 1V can be added for each level such that the Vpillars of L1 through L7 are 6V through approximately 0V.

In an embodiment, at the end of the first phase (e.g., at Tpulse), the wordlines 501, 502 are ramped to a pass voltage level (Vpass). In an embodiment, the unselected wordlines are ramped in seven ramping levels to Vpass for fine tuning the Vpillar (e.g., pillar potential). At time Tn, different programming stress levels have been applied to corresponding programming level (Ln), as represented by the following expression:

$$V_{stresslevel(Ln)} = Vpgm\_WL - Vpillar, \text{ here } Vpillar = (Vpass - Vwl\_time\_of\_float) \times boost\_ratio;$$

wherein Vwl_time_of_float is the voltage level of the ramping wordline voltage at the time the pillar (Pillar_n) corresponding to the programming level (Ln) is floated; and wherein the boost_ratio is a preset value (e.g., 1, 0.8, 0.6, etc.) corresponding to an amount of boost to the Vpillar as a function of the ramping wordline voltage.

In an embodiment, in accordance to the second variation noted above, the selected SGD 504B may be maintained at Vsgd_high. According to this variation, as shown in FIG. 5, the selected SGD 504B remains at Vsgd_high during the first phase of the programming operation (e.g., the selected SGD 504B is not toggled). According to this variation, with the selected SGD 504B remaining at Vsgd_high, the floating of each pillar is initiated by toggling the voltage (Vbl) of the bitline 503 corresponding to a respective pillar from approximately 0V to Vbl_high. For example, the L1 bitline can be toggled from ground (e.g., 0V) to a high voltage ($V_{BL\_high}$), as illustrated by the arrow 506, in order to float Pillar1. In an embodiment, the toggling of the L1 bitline to $V_{BL\_high}$ ensures Pillar1 is floated and Vpillar1 can be boosted in accordance with the wordline ramping level at the time of the floating, and repeatedly boosted each time the wordline ramping level increases.

Figure 6:
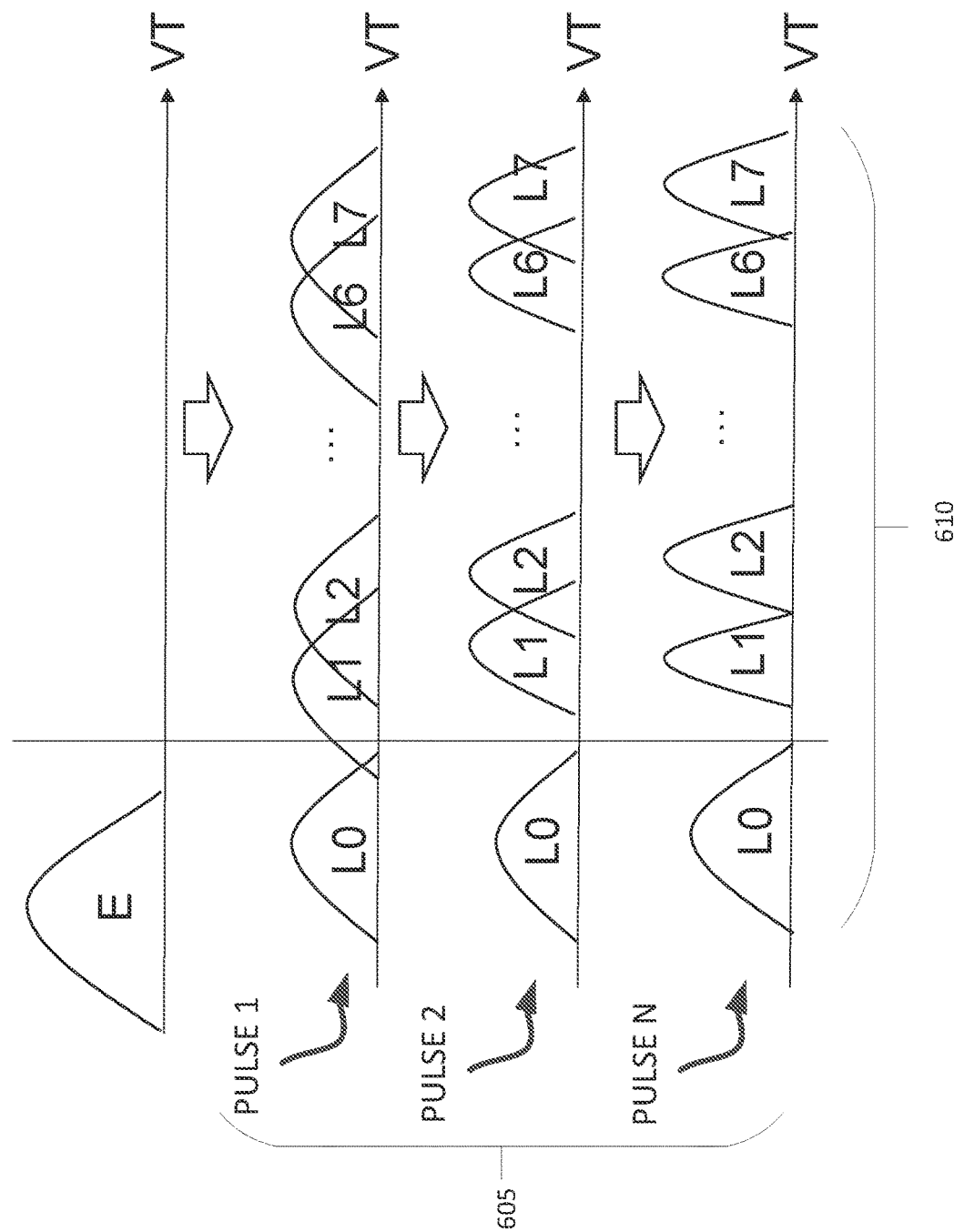
FIG. 6 illustrates an example programming operation including multiple pulses used for all levels programming of a memory device in a memory sub-system in accordance with one or more embodiments of the present disclosure.

FIG. 6 illustrates an example programming operation including a set of multiple pulses 605 (e.g., pulse 1, pulse 2 . . . pulse N) applied to program all programming levels (e.g., L1, L2, . . . L7) of the identified set of memory cells of the memory array, according to embodiments of the present disclosure. As shown in FIG. 6, each respective pulse (e.g., Pulse 1, Pulse 2 . . . and Pulse N) is used to program each of programming levels (e.g., L1 to L7) of a memory device in a memory sub-system in accordance with one or more embodiments of the present disclosure. In an embodiment, each pulse programs an entire set of program levels 610 (e.g., all levels) of the memory cells together. In an embodiment, the set of pulses 605 are applied to a target wordline (e.g., $WL_n$) associated with the set of memory cells to be programmed, as shown and described with reference to FIGS. 4-6.

As shown in FIGS. 5 and 6, during the second phase of the programming operation, a first programming pulse (e.g., Pulse 1 of FIG. 6) is applied at time Tpulse of FIG. 5. In an embodiment, the first programming pulse programs each of the programming levels (e.g., L1 to L7). In an embodiment, a programming voltage (Vpgm) of each pulse is applied to the selected wordline 501 to program each of the levels (L1 to L7 of a TLC memory device). In an embodiment, for the memory cells in a selected page, the same Vpgm_WL is applied on the second phase Vpgm. However, different Vpillars are setup during the first phase depending on the corresponding target data level. In an embodiment, the different $V_{stresslevels}$ are applied on the memory cells of L1 to L7. In an embodiment, a series of programming pulses (e.g., as shown in FIG. 6 as applied to the target wordline 501) to complete the programming of the set of programming levels. In an embodiment, for each pulse of the set of pulses applied, a program verify operation can be performed for each programming level to verify that target voltage corresponding to each respective programming level has been reached.

In the examples shown in FIGS. 4-6, a set of programming pulses are applied to a selected wordline (WLn). In an embodiment, a first set of unselected wordlines including WLn-1 and WLn+1 through WLn+x, as shown in FIG. 4, are ramped to a pass voltage (Vpass) for programming levels L1 to L7 (e.g., WLn+1 and above are ramped in seven levels to Vpass for fine tuning the corresponding pillar potential). In an embodiment, the pillar potential may stay on approximately 0V through a conduction with corresponding bitline for L7 program or be inhibited on any of the seven voltages (e.g., between 0V and Vpass) for L0~L6 program, depending on user data levels. In an embodiment, a second set of unselected wordlines including WLn−2 through WLn−y are set to 0V (e.g., SGS~0V, SGD~0V).

Figure 7:
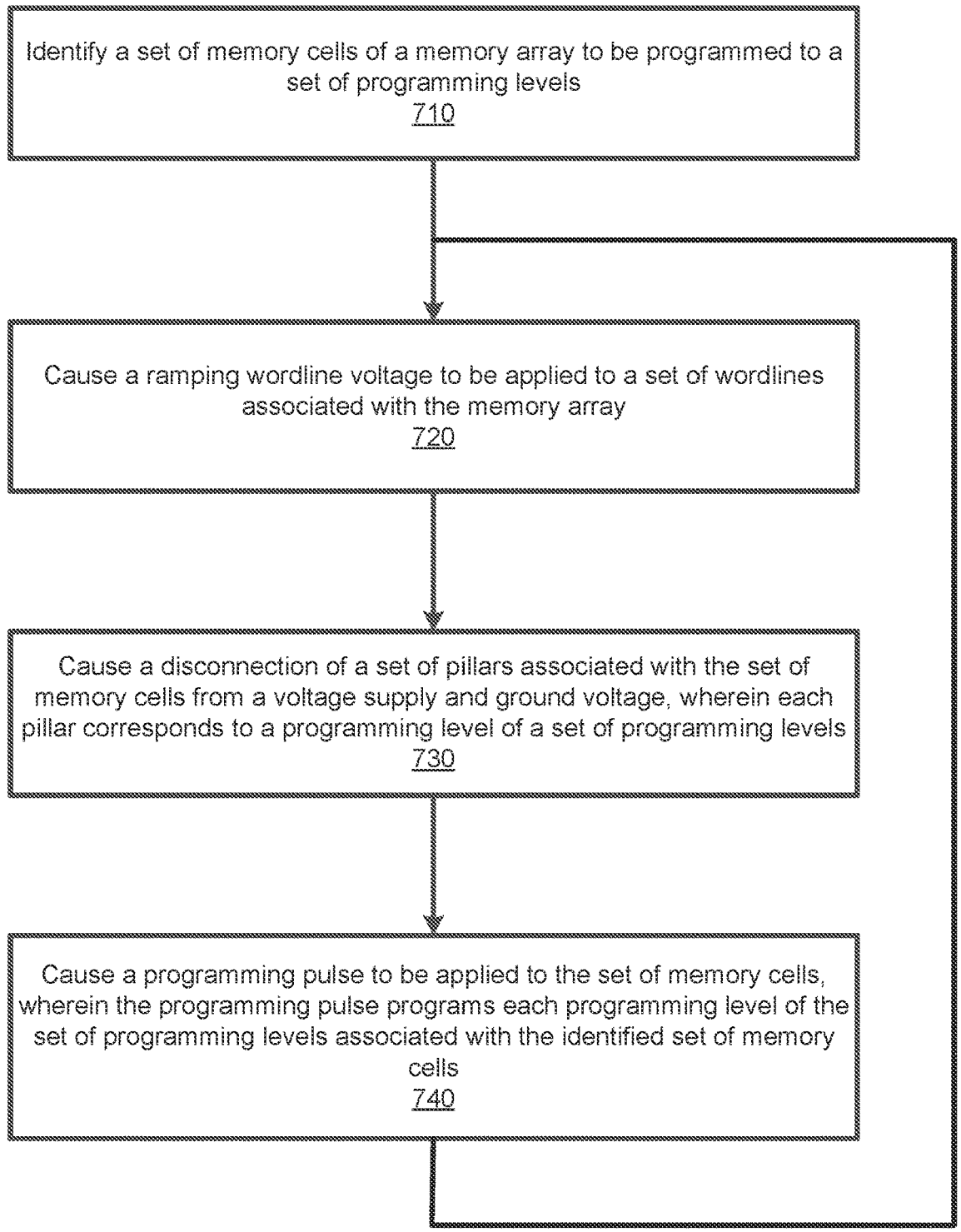
FIG. 7 is a flow diagram of an example method of all levels programming of a memory device in a memory sub-system in accordance with one or more embodiments of the present disclosure.

FIG. 7 is a flow diagram of an example method 700 of all levels programming of a memory device in a memory sub-system in accordance with some embodiments of the present disclosure. The method 700 is described with reference to FIGS. 4-6. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by program manager 134 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, a set of memory cells is identified. For example, processing logic (e.g., program manager 134) can receive, from a requestor, such as a memory interface 113 of a memory sub-system controller 115, a request to perform a memory access operation on a memory array, such as memory array 250, of a memory device, such as memory device 130. In one embodiment, the memory access operation comprises a program operation to program the set of memory cells to a set of programming levels (e.g., L1 to L7; wherein L0 is an erase state). In an embodiment, the program operation is directed to one or more specific memory cell addresses. In one embodiment, the processing logic can identify the set of memory cells (e.g., a subset of the memory cells of memory array 250 or 450 (described in greater detail below), such as those memory cells associated with a certain wordline or multiple wordlines of memory array 250). In one embodiment, the set of memory cells are configured as MLC memory (e.g., any type of memory cells that store more than one bit per cell including 2 bits, 3 bits, 4 bits, or more bits per cell). In an embodiment, the identified set of memory cells are to be programmed to multiple programming levels (e.g., L1, L2 . . . L7 for a TLC memory device). In an embodiment, the request includes a set of physical or logical addresses corresponding to the set of memory cells to be programmed. In an embodiment, the processing logic identifies the set of memory cells based on the set of addresses provided as part of the request.

At operation 720, a voltage is applied. For example, the processing logic can cause a ramping wordline voltage to be applied to one or more wordlines of the memory array (e.g., ramping wordline voltage applied to target wordline 501, as described in detail with reference to FIG. 5). In an embodiment, the all levels programming operation includes a first phase wherein an increasing or ramping wordline voltage (e.g., a voltage applied to one or more wordlines that is periodically ramped or increased by a wordline step voltage) is applied to a set of wordlines of the memory array (e.g., a selected wordline corresponding to the set of identified memory cells to be programmed and one or more unselected wordlines). For example, upon identifying a set of memory cells to be programmed (e.g., the memory cells associated with one or more wordlines of a memory array identified in operation 710), control logic of the memory device can initiate a first phase of the all levels programming operation during which a ramping wordline voltage is applied to a set of wordlines including a target wordline associated with the set of memory cells to be programmed.

At operation 730, a set of voltage levels are established. In an embodiment, as the ramping wordline voltage is applied to the set of wordlines (in operation 720), the set of pillars are floated in sequence. In an embodiment, the pillars refer to the channel regions (e.g., composed of polysilicon) of the access transistors of a vertical string of memory cells. In an embodiment, by floating each pillar associated with a respective programming level at different times in operation 730, each pillar is exposed to a different length of the wordline voltage ramp process while in the floating state. In an embodiment, as a result each pillar is boosted to a different voltage as a function of the different exposure times associated with the ramping wordline voltage. For example, a first pillar that is floated first in sequence is exposed to a longest relative length of time of the wordline voltage and, as such, is boosted to a highest voltage level, a second pillar that is floated second in sequence is exposed to a next longest relative length of time of the wordline voltage and, as such, is boosted to a next highest voltage level, and so on.

For example, in operation 730, the processing logic can cause a disconnection of a set of pillars associated with the set of memory cells from a voltage supply and ground voltage (i.e., ground), wherein each pillar corresponds to a programming level of a set of programming levels (e.g., L1 to L7 for a TLC memory device). In an embodiment, during the first phase of the all levels programming operation, respective pillars (e.g., vertical conductive traces of the memory array) corresponding to programming levels (e.g., L1 to L6 for a TLC memory device) are floated (e.g., disconnected from both a voltage supply and a ground). In an embodiment, the set of pillars corresponding to different programming levels are floated in sequence during the first phase (e.g., a first pillar corresponding to L1 is floated at a first time, a second pillar corresponding to L2 is floated at a second time, and so on).

In an embodiment, the pillars are floated by turning a corresponding source-side select transistor (SGD) and a corresponding drain-side select transistor (SGS) off. In an embodiment, a pillar can be floated by turning both a select gate source (SGS) off and select gate drain (SGD) off (e.g., a selected SGD is toggled from a high voltage level (e.g., Vsgd_high) to approximately 0V to prevent a corresponding bitline from discharging to the corresponding pillar). In an embodiment, a bitline corresponding to the first pillar associated with the programming level L1 is toggled from approximately 0V to a high voltage level (e.g., $V_{BL\_high}$) to ensure the pillar remains floating during the remainder of the first phase (e.g., application of the ramping wordline voltage).

In an embodiment, once floated, a voltage of each pillar (Vpillar) can be periodically boosted or increased in accordance with each step or increase of the ramping wordline voltage (e.g., each step of the ramping wordline voltage increases or boosts the pillar voltage for a pillar that is floating). At the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains approximately 0V during the first phase).

At operation 740, a programming pulse is applied. For example, the processing logic can cause a programming pulse to be applied to the set of memory cells (e.g., the set of memory cells of memory array 150 of FIG. 1B or memory array 450 of FIG. 4), wherein the programming pulse programs all programming levels associated with the identified set of memory cells. In an embodiment, the programming pulse can be applied to the one or more target wordlines associated with the set of memory cells to be programmed (e.g., the set of memory cells identified in operation 710), wherein the programming pulse programs each of the programming levels together (e.g., programming levels L1 to L7 are programmed using the programming pulses). In an embodiment, the boosting of the pillar voltages during a first phase enables the programming of all of the programming levels together using each programming pulse, the memory cells of the respective programming levels can be raised to the corresponding target voltage level in quicker and more efficient manner.

In an embodiment, operations 720-740 can be iteratively executed (e.g., phase 1 and phase 2 shown in FIG. 5 are iteratively performed), wherein each execution of operation 340 includes the application of a single programming pulse until each of the programming levels reach the corresponding target voltage level. For example, operations 720-740 can be iteratively performed to enable the execution of pulse 1, pulse 2 . . . pulse N of FIG. 6 until all of the programming levels (e.g., L1 to L7) have been programmed. For each pulse of the set of pulses, a program verify operation can be performed for each programming level to verify that target voltage corresponding to each respective programming level has been reached. In an embodiment, the processing logic completes the execution of method 700 in response to verifying (using program verify operations) that all of the programming levels have been programmed (e.g., following the application of set of pulses in accordance with the iterative performance of operations 720-740 of method 700). In an example, the all levels programming operation can include a set of pulses (e.g., six pulses) to program seven programming levels, results in the application of forty-two program verify operations).

In an embodiment, as shown in FIG. 7, operations 720 through 740 can be repeated following the causing of each programming pulse and associated program verify operations until the programming of each programming level is complete.

Advantageously, the all levels programming operation results in a reduction of programming time. In particular, the programming time is reduced by performing fewer programming pulses, as compared to other programming algorithms such as ISPP. In an embodiment, the total programming time associated with the all levels programming operation is comprises of a time corresponding to performing the wordline ramping (e.g., performing six wordline ramps), a set of programming pulses to program each programming level together (e.g., six pulses) and a set of program verify operations (e.g., forty-two program verify operations, wherein a program verify operation is performed for each level (e.g., seven levels) for each pulse (e.g., six pulses). This results in a significant reduction in Tprog, less energy per bit, and a wordline peak current reduction. In addition, in an embodiment, the program verify operations are performed for each program pulse and each programming level, therefore no program verify skipping is needed. This simplifies the control of the memory sub-system and achieves verified target programming levels. Accordingly, the overall quality of service level provided by the memory sub-system is improved.

Figure 8:
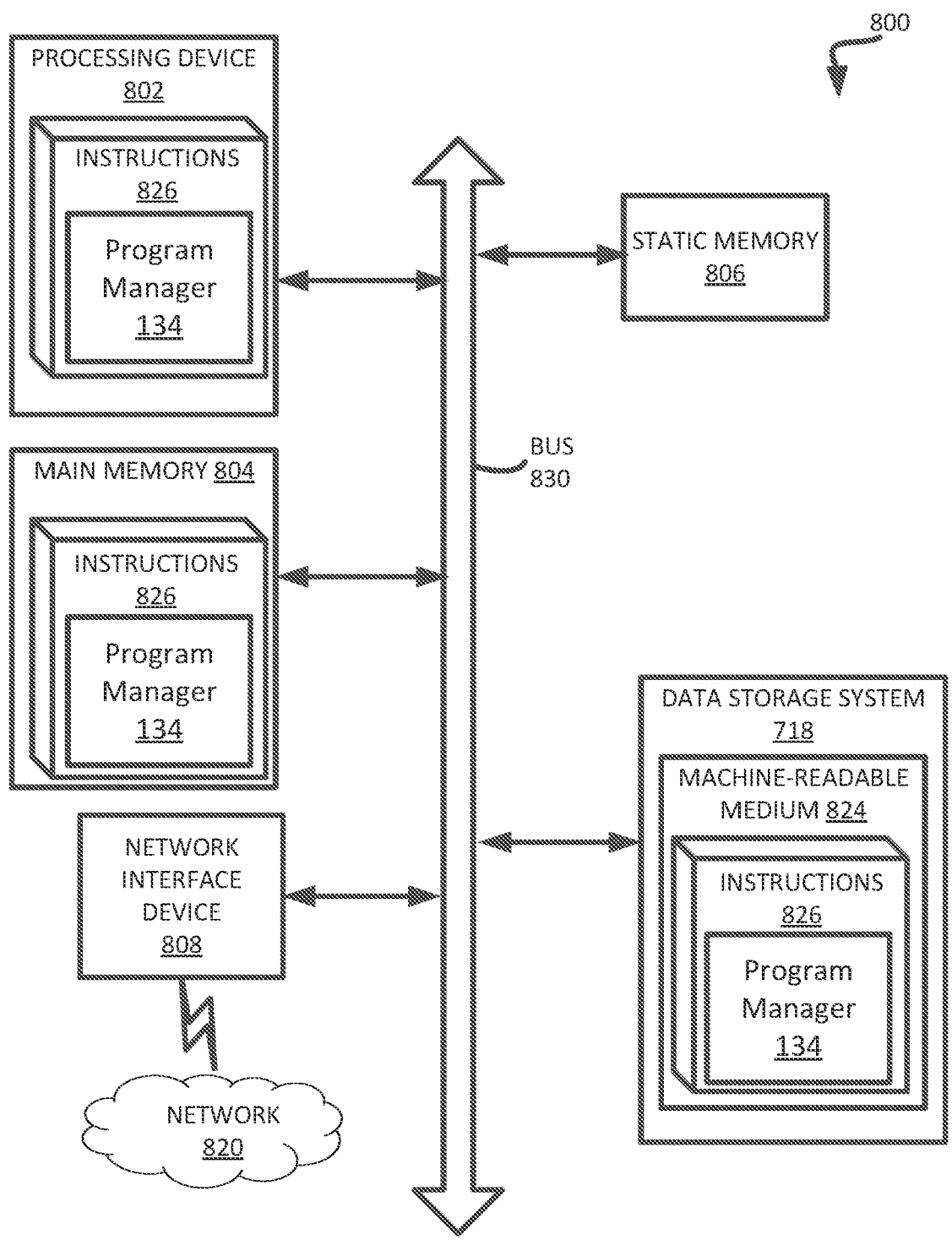
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to program manager 134 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a plurality of memory cells configured as a multi-level cell (MLC) memory; and
   control logic, operatively coupled with the memory array, to perform operations comprising:
   identifying a set of memory cells to be programmed during a program operation;
   causing, during a first time period of the program operation, a ramping wordline voltage to be applied to a set of wordlines associated with the memory array;
   causing, during the first time period, a disconnection of a set of pillars associated with the set of memory cells from a voltage supply and ground voltage, wherein each pillar corresponds to a respective programming level of a set of programming levels; and
   causing, during a second time period of the program operation, a programming pulse to be applied to the set of memory cells, wherein the programming pulse programs each programming level of the set of programming levels associated with the identified set of memory cells.

2. The memory device of claim 1, wherein causing the disconnection of the set of pillars comprises causing a toggling of a first select gate drain corresponding to a first pillar of the set of pillars from a first voltage level to ground.

3. The memory device of claim 1, wherein the control logic is to perform further operations comprising causing a toggling of a first bitline voltage level of a first bitline corresponding to a first pillar.

4. The memory device of claim 1, wherein causing the disconnection of the set of pillars comprises floating a first pillar of the set of pillars at a first time during the first time period.

5. The memory device of claim 4, wherein a first pillar voltage of the first pillar is incrementally boosted each time the ramping wordline voltage is increased.

6. The memory device of claim 1, wherein causing the disconnection of the set of pillars comprises floating each pillar of the set of pillars in sequence during the first time period.

7. The memory device of claim 1, wherein the control logic is to perform further operations comprising:
   responsive to the program pulse being applied, performing one or more program verify operations to verify whether the set of memory cells were programmed to the respective programming levels of the plurality of programming levels.

8. The memory device of claim 1, wherein the control logic is to perform further operations comprising:
causing, during a third time period of the program operation, the ramping wordline voltage to be applied to the set of wordlines associated with the memory array;
causing, during the third time period, the disconnection of the set of pillars associated with the set of memory cells from the voltage supply and the ground voltage; and
causing, during a fourth time period of the program operation, a subsequent programming pulse to be applied to the set of memory cells, wherein the subsequent programming pulse programs each programming level of the set of programming levels associated with the identified set of memory cells.

9. The memory device of claim 1, wherein causing the disconnection of the set of pillars comprises floating, sequentially at intervals of the first time period, a respective pillar of the set of pillars, and wherein, when floating, a pillar voltage corresponding to the respective pillar is boosted in accordance with increases to the ramping wordline voltage.

10. A method comprising:
identifying a set of memory cells to be programmed during a program operation;
causing, during a first time period of the program operation, a ramping wordline voltage to be applied to a set of wordlines associated with the set of memory cells;
causing, during the first time period, a disconnection of a set of pillars associated with the set of memory cells from a voltage supply and ground voltage, wherein each pillar corresponds to a programming level of a set of programming levels; and
causing, during a second time period of the program operation, a set of programming pulses to be applied to the set of memory cells, wherein each programming pulse of the set of programming pulses programs each programming level of the set of programming levels associated with the identified set of memory cells.

11. The method of claim 10, wherein causing the disconnection of the set of pillars comprises causing a toggling of a first select gate drain corresponding to a first pillar of the set of pillars from a first voltage level to ground.

12. The method of claim 10, further comprising causing a toggling of a first bitline voltage level of a first bitline corresponding to a first pillar.

13. The method of claim 10, wherein causing the disconnection of the set of pillars further comprises floating a first pillar of the set of pillars at a first time during the first time period.

14. The method of claim 13, wherein a first pillar voltage of the first pillar is incrementally boosted each time the ramping wordline voltage is increased.

15. The method of claim 10, wherein causing the disconnection of the set of pillars further comprises floating each pillar of the set of pillars in sequence during the first time period.

16. The method of claim 10, further comprising responsive to the programming pulse being applied, performing one or more program verify operations to verify whether the set of memory cells were programmed to the respective programming levels of the set of programming levels.

17. The method of claim 10, wherein a subset of unselected wordlines of the set of wordlines are ramped during the first time period to a pass voltage level.

18. The method of claim 10, wherein causing the disconnection of the set of pillars further comprises floating, sequentially at intervals of the first time period, each pillar of the set of pillars, and wherein, when floating, each pillar voltage is boosted in accordance with increases to the ramping wordline voltage.

19. A memory device comprising:
a memory array comprising a plurality of memory cells; and
control logic, operatively coupled with the memory array, to perform operations comprising:
applying, during a first time period of a program operation, a ramping wordline voltage to a set of wordlines associated with a set of memory cells of the memory array;
floating, at a first set of different times during the first time period, a respective pillar of a set of pillars associated with of memory cells, wherein each pillar voltage, when floated, is boosted in accordance with each increase of the ramping wordline voltage; and
causing, during a second time period, a first programming pulse to be applied to the set of memory cells, wherein the first programming pulse programs each programming level of the set of programming levels associated with the set of memory cells.

20. The memory device of claim 19, wherein the control logic is to perform further operations comprising:
applying, during a third time period of the program operation, the ramping wordline voltage to the set of wordlines associated with the memory array;
floating, at a second set of different times during the third time period, the respective pillar of the set of pillars associated with the plurality of memory cells, wherein each pillar voltage, when floated, is boosted in accordance with each increase of the ramping wordline voltage; and
causing, during a fourth time period, a second programming pulse to be applied to the set of memory cells, wherein the second programming pulse programs each programming level of the set of programming levels associated with the set of memory cells.

* * * * *